United States Patent
Pasadyn et al.

(10) Patent No.: US 7,797,073 B1
(45) Date of Patent: Sep. 14, 2010

(54) CONTROLLING PROCESSING OF SEMICONDUCTOR WAFERS BASED UPON END OF LINE PARAMETERS

(75) Inventors: Alexander J. Pasadyn, Austin, TX (US); Christopher A. Bode, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 1959 days.

(21) Appl. No.: 10/156,541

(22) Filed: May 28, 2002

(51) Int. Cl.
*G06F 19/00* (2006.01)

(52) U.S. Cl. .......................... 700/121; 438/5
(58) Field of Classification Search ........... 700/45, 700/109, 121; 438/5
See application file for complete search history.

(56) References Cited

U.S. PATENT DOCUMENTS

| | | | |
|---|---|---|---|
| 6,230,069 B1 * | 5/2001 | Campbell et al. | 700/121 |
| 6,577,915 B1 * | 6/2003 | Cooperberg et al. | 700/121 |
| 6,613,590 B2 * | 9/2003 | Simmons | 438/14 |
| 2002/0193902 A1 * | 12/2002 | Shanmugasundram et al. | 700/121 |
| 2003/0199112 A1 * | 10/2003 | Shanmugasundram et al. | 438/17 |

* cited by examiner

*Primary Examiner*—Kidest Bahta
(74) *Attorney, Agent, or Firm*—Williams, Morgan & Amerson, P.C.

(57) ABSTRACT

A method and an apparatus for processing semiconductor wafer based upon end-of-line (EOL) parameters. A target end-of-line parameter relating to a semiconductor wafer is determined. An inline parameter relating to processing of the semiconductor wafer is controlled in response to the target end-of-line parameter using a controller. Controlling the inline parameter includes adjusting a target inline parameter that correlates to the inline parameter.

35 Claims, 8 Drawing Sheets

CONTROLLING PROCESSING OF SEMICONDUCTOR WAFERS BASED UPON END OF LINE PARAMETERS

BACKGROUND OF THE INVENTION

1. Field of the Invention

This invention relates generally to semiconductor manufacturing, and, more particularly, to a method and apparatus for a modeling inline parameters and end-of-line (EOL) parameters for controlling processing of semiconductor wafers based upon the EOL parameters.

2. Description of the Related Art

The technology explosion in the manufacturing industry has resulted in many new and innovative manufacturing processes. Today's manufacturing processes, particularly semiconductor manufacturing processes, call for a large number of important steps. These process steps are usually vital, and therefore, require a number of inputs that are generally fine-tuned to maintain proper manufacturing control.

The manufacture of semiconductor devices requires a number of discrete process steps to create a packaged semiconductor device from raw semiconductor material. The various processes, from the initial growth of the semiconductor material, the slicing of the semiconductor crystal into individual wafers, the fabrication stages (etching, doping, ion implanting, or the like), to the packaging and final testing of the completed device, are so different from one another and specialized that the processes may be performed in different manufacturing locations that contain different control schemes.

Generally, a set of processing steps is performed across a group of semiconductor wafers, sometimes referred to as a lot. For example, a process layer composed of a variety of materials may be formed across a semiconductor wafer. Thereafter, a patterned layer of photoresist may be formed across the process layer using known photolithography techniques. Typically, an etch process is then performed across the process layer using the patterned layer of photoresist as a mask. This etching process results in the formation of various features or objects in the process layer. Such features may be used for a gate electrode structure for transistors. Many times, trench isolation structures are also formed across the substrate of the semiconductor wafer to isolate electrical areas across a semiconductor wafer. One example of an isolation structure that can be used is a shallow trench isolation (STI) structure. Typically, forming trenches across the semiconductor wafer and filling such trenches with an insulating material, such as silicon dioxide, form STI structures across the semiconductor wafers.

The manufacturing tools within a semiconductor manufacturing facility typically communicate with a manufacturing framework or a network of processing modules. Each manufacturing tool is generally connected to an equipment interface. The equipment interface is connected to a machine interface to which a manufacturing network is connected, thereby facilitating communications between the manufacturing tool and the manufacturing framework. The machine interface can generally be part of an advanced process control (APC) system. The APC system initiates a control script, which can be a software program that automatically retrieves the data needed to execute a manufacturing process.

FIG. 1 illustrates a typical semiconductor wafer 105. The semiconductor wafer 105 typically includes a plurality of individual semiconductor die 103 arranged in a grid 150. Using known photolithography processes and equipment, a patterned layer of photoresist may be formed across one or more process layers that are to be patterned. As part of the photolithography process, an exposure process is typically performed by a stepper on approximately one to four die 103 locations at a time, depending on the specific photomask employed. The patterned photoresist layer can be used as a mask during etching processes, wet or dry, performed across the underlying layer or layers of material, e.g., a layer of polysilicon, metal or insulating material, to transfer the desired pattern to the underlying layer. The patterned layer of photoresist is comprised of a plurality of features, e.g., line-type features or opening-type features that are to be replicated in an underlying process layer.

Turning now to FIG. 2, a process flow of a prior art manufacturing process of semiconductor wafers 105 in a flow chart form is illustrated. A manufacturing system processes a lot of semiconductor wafers 105 (block 210). Upon processing the semiconductor wafers 105, the manufacturing system may acquire metrology data relating to the processed semiconductor wafers 105 (block 220). The manufacturing system may then analyze the metrology data in order to examine possible errors that may have occurred during processing of the semiconductor wafers 105 (block 230). Based upon the analysis of the metrology data, the manufacturing system may then perform adjustments to the processes performed on subsequent semiconductor wafers 105 (block 240).

Utilizing the prior art process flow implemented by current manufacturing systems, a lot of semiconductor wafers 105 may be processed through several process steps without a substantial focus on end-of-line parameters relating to the processed semiconductor wafers 105. In other words, a lot of semiconductor wafers 105 may be pushed through a string of manufacturing processes based on available data, without a true focus on several end-of-line parameters, such as the yield of devices manufactured from the processed semiconductor wafers 105, the performance of such devices, and the like. Using the current methodology, results in the yields or performance of devices produced from the semiconductor wafers 105 may not fall within targeted expectations.

The present invention is directed to overcoming, or at least reducing, the effects of, one or more of the problems set forth above.

SUMMARY OF THE INVENTION

In one aspect of the present invention, a method is provided for processing semiconductor wafers based upon an end-of-line parameter. A target end-of-line parameter relating to a semiconductor wafer is determined. An inline parameter relating to processing of the semiconductor wafer is controlled in response to the target end-of-line parameter using a controller. Controlling the inline parameter includes adjusting a target inline parameter that correlates to the inline parameter.

In another aspect of the present invention, a system is provided for processing semiconductor wafers based upon an end-of-line parameter. The system of the present invention includes a processing tool to process a first semiconductor wafer and a process controller operatively coupled to the processing tool. The process controller is adapted to control a process operation performed by the processing tool to adjust an inline parameter relating to the semiconductor wafer based upon a target end-of-line (EOL) parameter of the first semiconductor wafer.

In another aspect of the present invention, an apparatus is provided for processing semiconductor wafers based upon an end-of-line parameter. The apparatus of the present invention includes a process controller for controlling a processing tool.

The process controller is adapted to control a process operation performed by the processing tool to adjust an inline parameter relating to a first semiconductor wafer based upon a target end-of-line (EOL) parameter of the first semiconductor wafer.

In yet another aspect of the present invention, a computer readable program storage device encoded with instructions is provided for processing semiconductor wafer based upon an end-of-line parameter. The computer readable program storage device encoded with instructions when executed by a computer determines a target end-of-line parameter relating to a semiconductor wafer and controls an inline parameter relating to processing of the semiconductor wafer in response to the target end-of-line (EOL) parameter using a controller. Controlling the inline parameter includes adjusting a target inline parameter that correlates to the inline parameter.

BRIEF DESCRIPTION OF THE DRAWINGS

The invention may be understood by reference to the following description taken in conjunction with the accompanying drawings, in which like reference numerals identify like elements, and in which.

Figure 1:
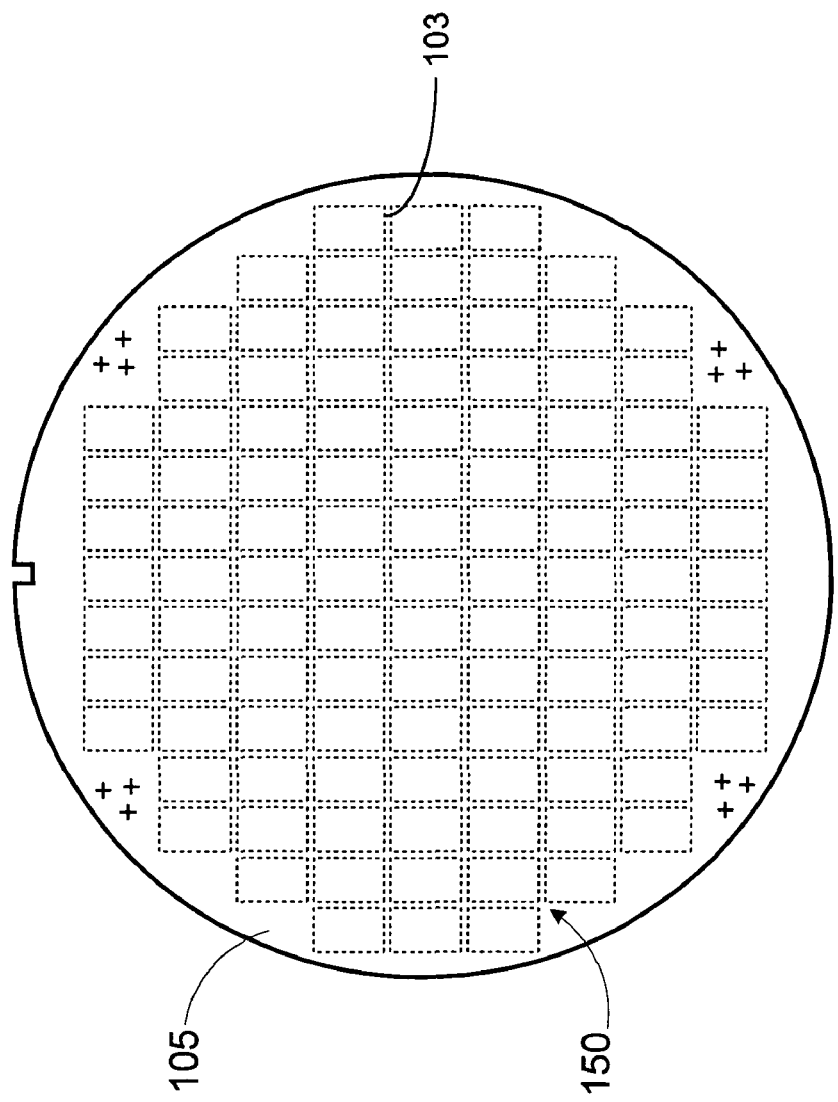
FIG. 1 is a simplified diagram of a prior art semiconductor wafer being processed.
Figure 2:
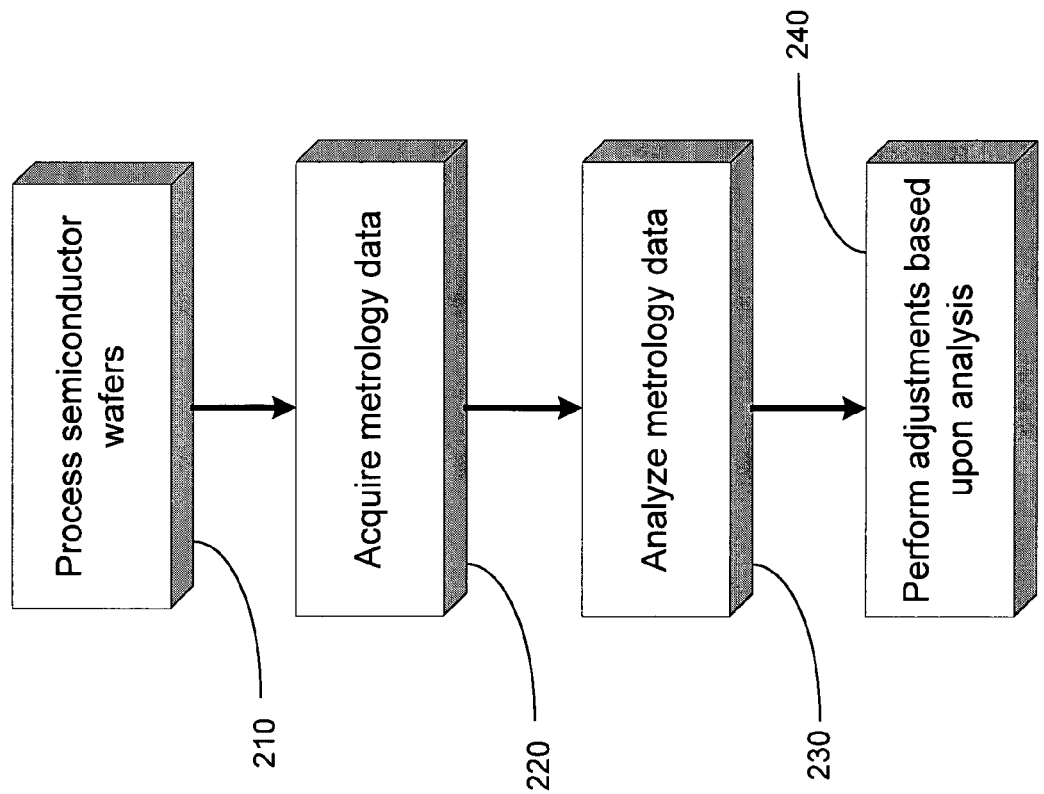
FIG. 2 illustrates a simplified flowchart depiction of a prior art process flow during manufacturing of semiconductor wafers.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

There are many discrete processes that are involved in semiconductor manufacturing. Many times, semiconductor devices are stepped through multiple manufacturing process tools. Embodiments of the present invention provide for modeling final parameters of processed semiconductor wafers 105 at an end of a manufacturing line (end-of-line parameters) and correlating them with processing parameters to improve yield of products produced from processed semiconductor wafers 105, while maintaining predetermined performance requirements.

Embodiments of the present invention provide for associating targeted end-of-line parameters with particular inline parameters, such that adjustments to the inline parameters may be made to achieve the targeted end-of-line (EOL) parameters. The end-of-line parameters may include, but are not limited to, the yield relating to devices produced from the processed semiconductor wafers 105, the reliability of such devices, the performance of such devices, and the like. The inline parameters may include, but are not limited to, one of many measured factors of a processed semiconductor wafer 105, such as the critical dimensions of one or more structures formed on the semiconductor wafers 105, the film thickness resulting from a particular process performed on the semiconductor wafers 105, the accuracy of the overlay after photolithography processes, electrical resistivity measurements between at least two points on a semiconductor wafer 105, a duration of a deposition process, and the like.

Embodiments of the present invention allow for targeting particular end-of-line parameters and associating them with inline parameters by modeling particular inline parameters to end-of-line parameters, and adjusting inline parameters during the processing phase in order to achieve end-of-line results that are acceptably close to the targeted end-of-line parameters. Embodiments of the present invention provide for a sorted, weighted, objective function that may add weight to particular end-of-line parameters (i.e., deeming one parameter to be more important than another). One such example is adding weight to the performance characteristics of devices produced from the semiconductor wafers 105, more so than to another end-of-line parameter, such as the yield. One or more process/manufacturing models may be used to correlate a single inline parameter or a plurality of inline parameters to one or more end-of-line parameters. In other words, a single inline parameter may be correlated to a single EOL parameter or to a plurality of EOL parameters. Similarly, a plurality of inline parameters may be correlated to a single EOL parameter or to a plurality of EOL parameters. Depending upon which end-of-line parameter is important for a particular device to be manufactured (e.g., performance over yield) the weighted objective function may be implemented into the models to target inline parameters that may produce the desired targeted end-of-line parameters.

Figure 3:
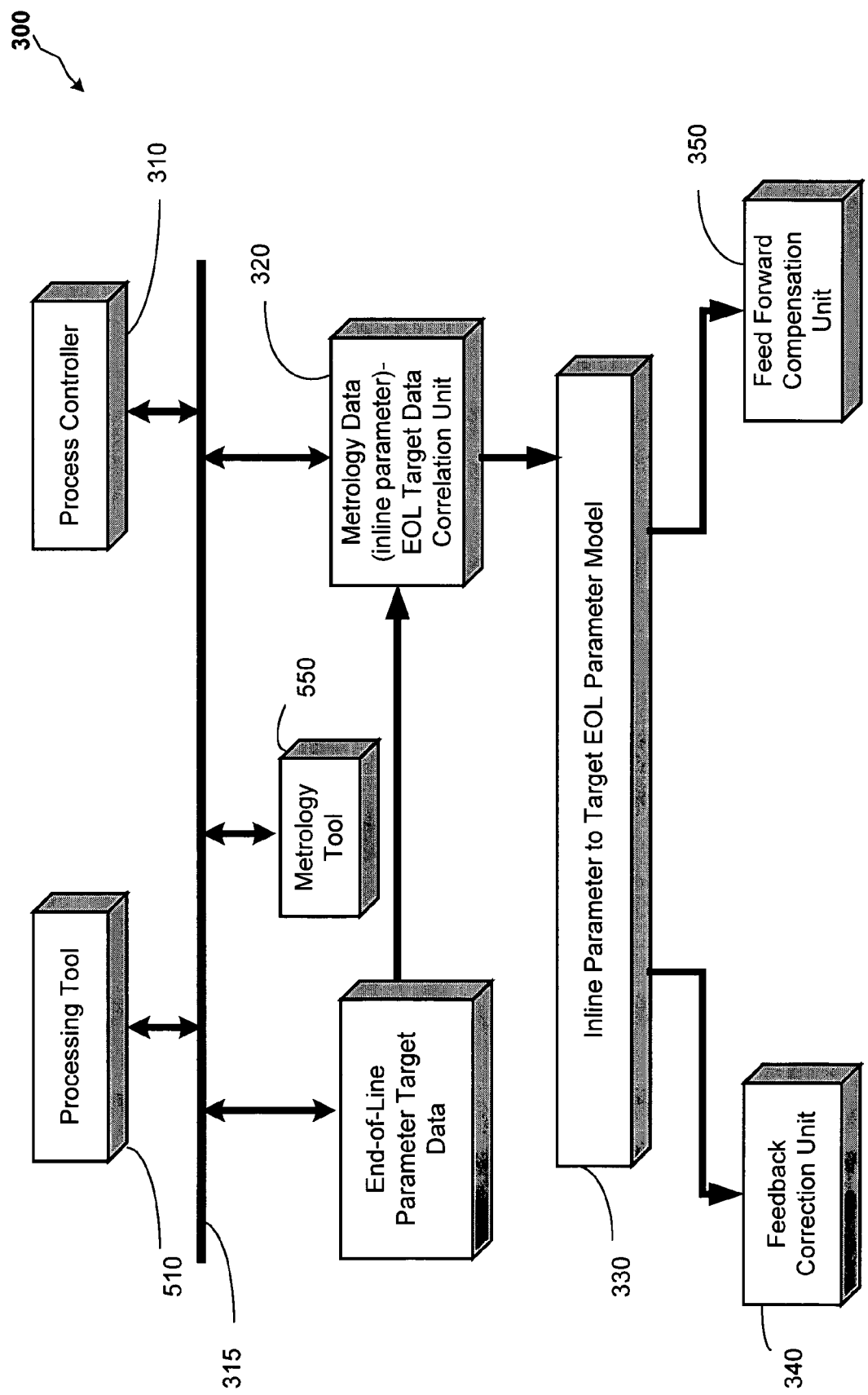
FIG. 3 is a block diagram representation of a system in accordance with one illustrative embodiment of the present invention.

Turning now to FIG. 3, a block diagram depiction of a system 300 for implementing embodiments of the present invention is illustrated. The system 300 comprises at least one processing tool 510 that may be controlled by a process controller 310. In one embodiment, the process controller 310 may be an APC framework, or may be implemented into an APC framework. The system 300 may also comprise a metrology tool 550 capable of acquiring metrology data relating to the processed semiconductor wafers 105. The process controller 310 may control the operation of the processing tool 510 and the metrology tool 550.

The system 300 also comprises a metrology data/inline parameter-EOL target data correlation unit 320. The inline parameter-EOL target data correlation unit 320 is capable of correlating inline parameters that may be provided by the metrology tool 550, to particular EOL target parameters that are received by the system 300. For example, particular critical dimension measurements may be attributable to certain performance characteristics of devices (e.g., the speed of operation of a device) produced from the processed semiconductor wafers 105. The system 300 then generates an "inline parameter-target EOL parameter model" 330 that is capable of modeling the relationship between certain inline parameters to particular EOL parameters of the semiconductor wafers 105. A more detailed description and illustration of the inline parameter-target EOL parameter model 330 is provided in FIGS. 4A and 4B and the accompanying description below.

The inline parameter-target EOL parameter model 330 produces target inline parameters that, if achieved during processing of semiconductor wafers 105, may result in target end-of-line parameters relating to the processed semiconductor wafers 105. In other words, adjusting or achieving target inline parameters based on the inline parameter-target EOL parameter model 330, may result in devices that achieve or approach the targeted end-of-line characteristics (e.g., performance, reliability, yield, etc.). Based upon the target inline parameter data produced by the inline parameter-target EOL parameter model 330, a feedback correction unit 340 may perform feedback corrections upon processes to be performed on subsequently processed semiconductor wafers 105 in a particular lot being processed. In other words, wafer-to-wafer feedback adjustments may be made utilizing the target inline parameters.

Similarly, a feed forward compensation unit 350 may utilize the target inline parameters to perform compensation adjustments to subsequent processes performed on the semiconductor wafers 105 within a particular lot. The feed-forward compensation may be performed in order to compensate for errors resulting from previous processes, to more closely approach target inline parameters. The processing tool 510, the metrology tool 550, the process controller 310, the metrology data/inline parameter to EOL target data correlation unit 320, the inline parameter-target EOL parameter model 330, the feedback correction unit 340, and the feed forward compensation unit 350 may all communicate via a system or network communications line 315. The system communications line 315 may be a computer bus link, a dedicated hardware communications link, a telephone system communications link, a wireless communications link, or other communications links that may be implemented by those skilled in the art having benefit of the present disclosure.

Figure 4A:
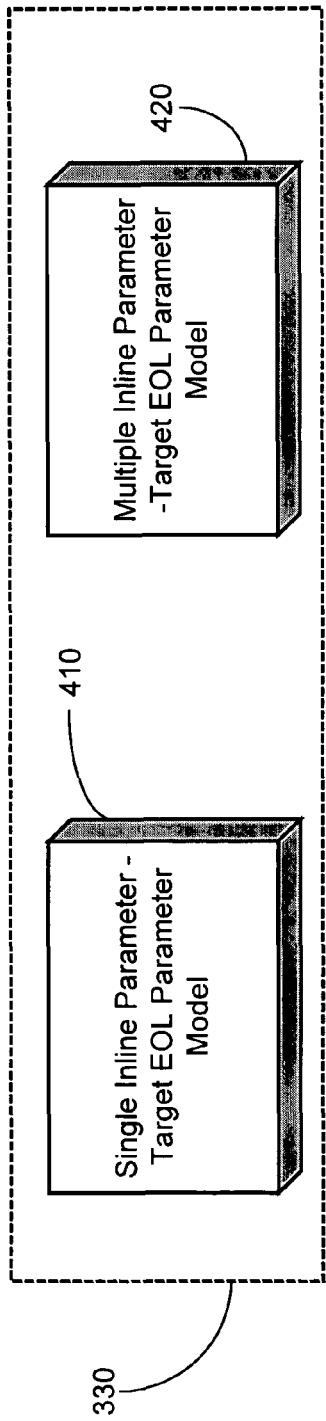
FIG. 4A illustrates a more detailed block diagram representation of an inline parameter-to-target end-of-line (EOL) parameter model of FIG. 3 in accordance with one illustrative embodiment of the present invention.
Figure 4B:
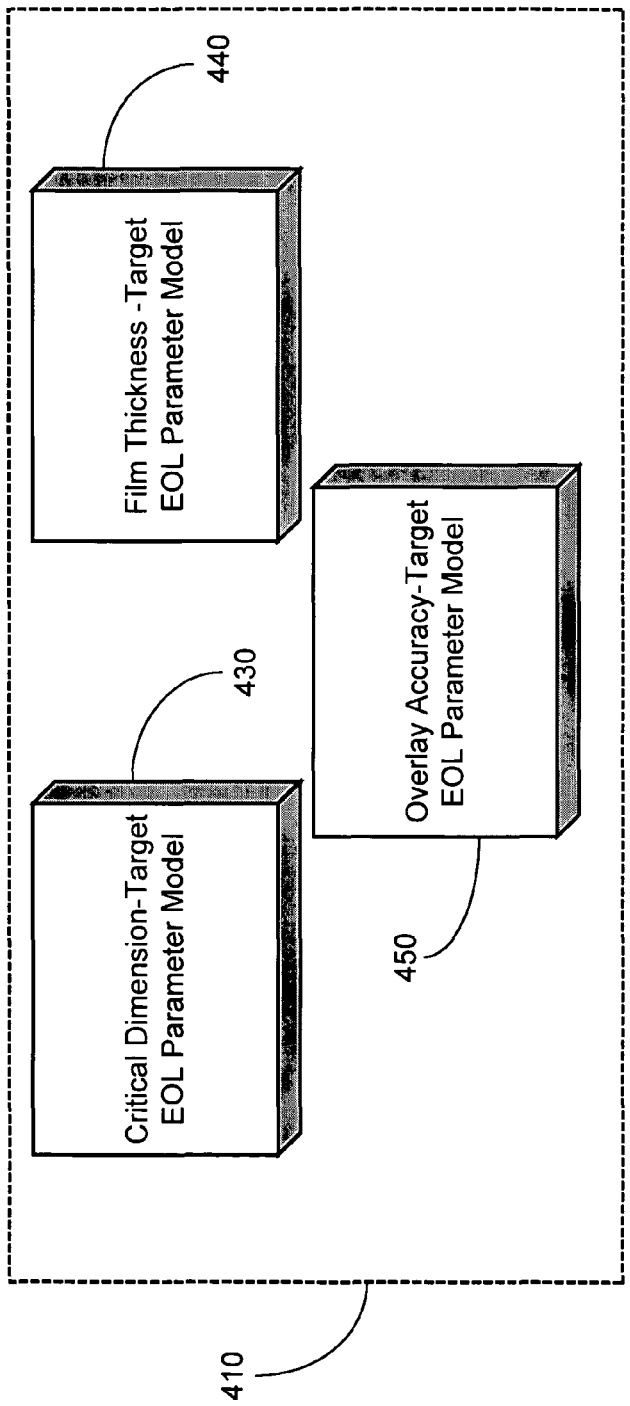
FIG. 4B illustrates a more detailed block diagram representation of a single inline parameter-to-target EOL parameter model of FIG. 4A, in accordance with one illustrative embodiment of the present invention.

Turning now to FIG. 4A, a block diagram representation of one embodiment of the inline parameter-target EOL parameter model 330 is illustrated. The inline parameter-target EOL parameter model 330 may comprise a plurality of models, such as a single inline parameter-target EOL parameter model 410 and/or a multiple inline parameter-target EOL parameter model 420. For example, the single inline parameter-target EOL parameter model 410 may model the relationship between critical dimension measurements relating to particular structures formed on the semiconductor wafer 105, and certain EOL parameters. One such example is modeling the relationship between critical dimension measurements relating to sidewall angles of transistors produced on the semiconductor wafers 105, and certain performance speed characteristics of the final device manufactured from the processed semiconductor wafers 105. Therefore, constant adjustments to the processing relating to forming the structure related to the critical dimensions may be made using the feedback correction unit 340 and/or the feed forward compensation unit 350. Such feedback adjustments may be performed to keep the critical dimensions relating to particular structures formed on the semiconductor wafer 105, within a targeted range to produce targeted EOL parameters.

Similarly, the multiple inline parameter-target EOL parameter model 420 may model the relationship between a plurality of inline parameters and a plurality of target EOL parameters. For example, the model 420 may provide analysis of the relationship between critical dimensions of certain structures formed on the semiconductor wafers 105 and the film thickness measurements of particular layers on the processed semiconductor wafers 105, and certain EOL characteristics. Data from the model 420 may be utilized to adjust a one or more inline parameters using the feedback correction unit 340 and/or the feed forward compensation unit 350 in order to realize targeted EOL parameters. Examples of the single inline parameter-target EOL parameter model 410 is provided in FIG. 4B, which illustrates a critical dimension-target EOL parameter model 430, a film thickness-target EOL parameter model 440, and/or an overlay accuracy-target EOL parameter model 450. The model 410 may also comprise other models that provide analysis between other inline parameters and particular target EOL parameters known to those skilled in the art having benefit of the present disclosure.

Certain weight or priority may be applied to a particular single inline parameter-target EOL parameters model 410 to give more importance to certain attributes, such as yield over performance and reliability. A weight function, which may be a software function, may be used by the model 330 to provide more importance to certain EOL parameters. The weight applied to the EOL parameter may be used to calculate an adjustment to a target inline parameter. Furthermore, if a particular EOL parameter, such as the yield, is not substantially important, a weight of zero may be given to the yield wherein a higher weight may be given to the reliability; and a medium weight may be given to the performance of devices produced from the processed semiconductor wafers 105. These weight assignments may be used to model a different set of target inline parameters. The system 300 is capable of acquiring metrology data on a wafer-to-wafer and/or a lot-to-lot basis and performing adjustments by modifying the inline parameter-target EOL parameter model 330 to achieve the targeted EOL parameters.

Figure 5:
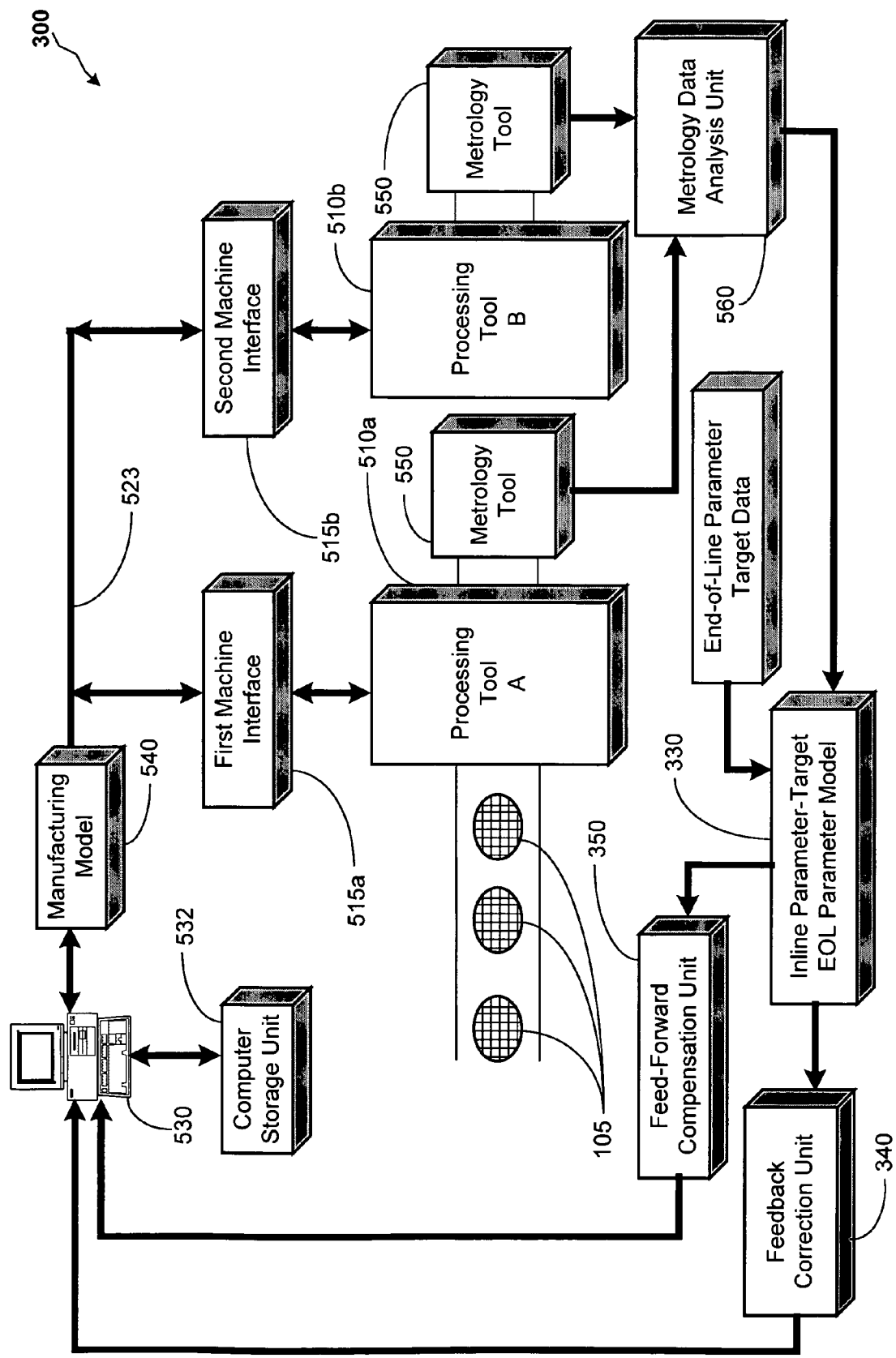
FIG. 5 illustrates a more detailed block diagram representation of the system shown in FIG. 3, in accordance with one illustrative embodiment of the present invention.

Turning now to FIG. 5, a more detailed block diagram of the system 300 in accordance with one embodiment of the present invention is illustrated. Semiconductor wafers 105 are processed on processing tools 510a, 510b using a plurality of control input signals, or manufacturing parameters, provided via a line or network 523. The control input signals, or manufacturing parameters, on the line 523 are sent to the processing tools 510a, 510b from a computer system 530 via machine interfaces 515a, 515b. The first and second machine interfaces 515a, 515b are generally located outside the processing tools 510a, 510b. In an alternative embodiment, the first and second machine interfaces 515a, 515b are located within the processing tools 510a, 510b. The semiconductor wafers 105 are provided to and carried from a plurality of processing tools 510. In one embodiment, semiconductor wafers 105 may be provided to a processing tool 510 manually. In an alternative embodiment, semiconductor wafers 105 may be provided to a processing tool 510 in an automatic fashion (e.g., robotic movement of semiconductor wafer 105). In one embodiment, a plurality of semiconductor wafers 105 is transported in lots, which may be stacked in cassettes, to the processing tools 510.

In one embodiment, the computer system 530 sends control input signals, or manufacturing parameters, on the line 523 to the first and second machine interfaces 515a, 515b. The computer system 530 is capable of controlling processing operations. In one embodiment, the computer system 530 is a process controller. The computer system 530 is coupled to a computer storage unit 532 that may contain a plurality of software programs and data sets. The computer system 530 may contain one or more processors (not shown) that are capable of performing the operations described herein. The computer system 530 employs a manufacturing model 540 to generate control input signals on the line 523. In one embodiment, the manufacturing model 540 contains a manufacturing recipe that determines a plurality of control input parameters that are sent on the line 523 to the processing tools 510a, 510b.

In one embodiment, the manufacturing model 540 defines a process script and input control that implement a particular manufacturing process. The control input signals (or control input parameters) on the line 523 that are intended for processing tool A 510a are received and processed by the first machine interface 515a. The control input signals on the line 523 that are intended for processing tool B 510b are received and processed by the second machine interface 515b. Examples of the processing tools 510a, 510b used in semiconductor manufacturing processes are steppers, etch process tools, deposition tools, and the like.

One or more of the semiconductor wafers 105 that are processed by the processing tools 510a, 510b can also be sent to a metrology tool 550 for acquisition of metrology data. The metrology tool 550 may be a scatterometry data acquisition tool, an overlay-error measurement tool, a critical dimension measurement tool, and the like. In one embodiment, a metrology tool 550 examines one or more processed semiconductor wafers 105. The metrology data analysis unit 560 may collect, organize, and analyze data from the metrology tool 550. The metrology data is directed to a variety of physical or electrical characteristics of the devices formed across the semiconductor wafers 105. For example, metrology data may be obtained as to line width measurements, depth of trenches, sidewall angles, thickness, resistance, and the like. Metrology data may be used to determine inline parameters, which may be used to quantify the EOL parameters based upon the inline parameters.

Metrology data that is organized and correlated by the metrology data analysis unit 560 is received by the inline parameter-target EOL parameter model 330 along with the EOL parameter target data. Data from the inline parameter-target EOL parameter model 330, which may produce modified target inline parameters, is sent to the feedback correction unit 340 and/or to the feed forward compensation unit 350. The feedback correction unit 340 may produce feedback data that may be implemented during the processing of subsequent semiconductor wafers 105 within a lot of semiconductor wafers 105, and send the feedback data to the computer system 530. The feed forward compensation unit 350 may produce feed forward compensation adjustments to be performed on subsequent processes performed on the semiconductor wafers 105 and is sent to the computer system 530. The computer system 530 may implement changes based upon the feed forward compensation data and the feedback correction data from the units 350, 340, respectively, and implement the modifications to the operations of the processing tools 510.

Figure 6:
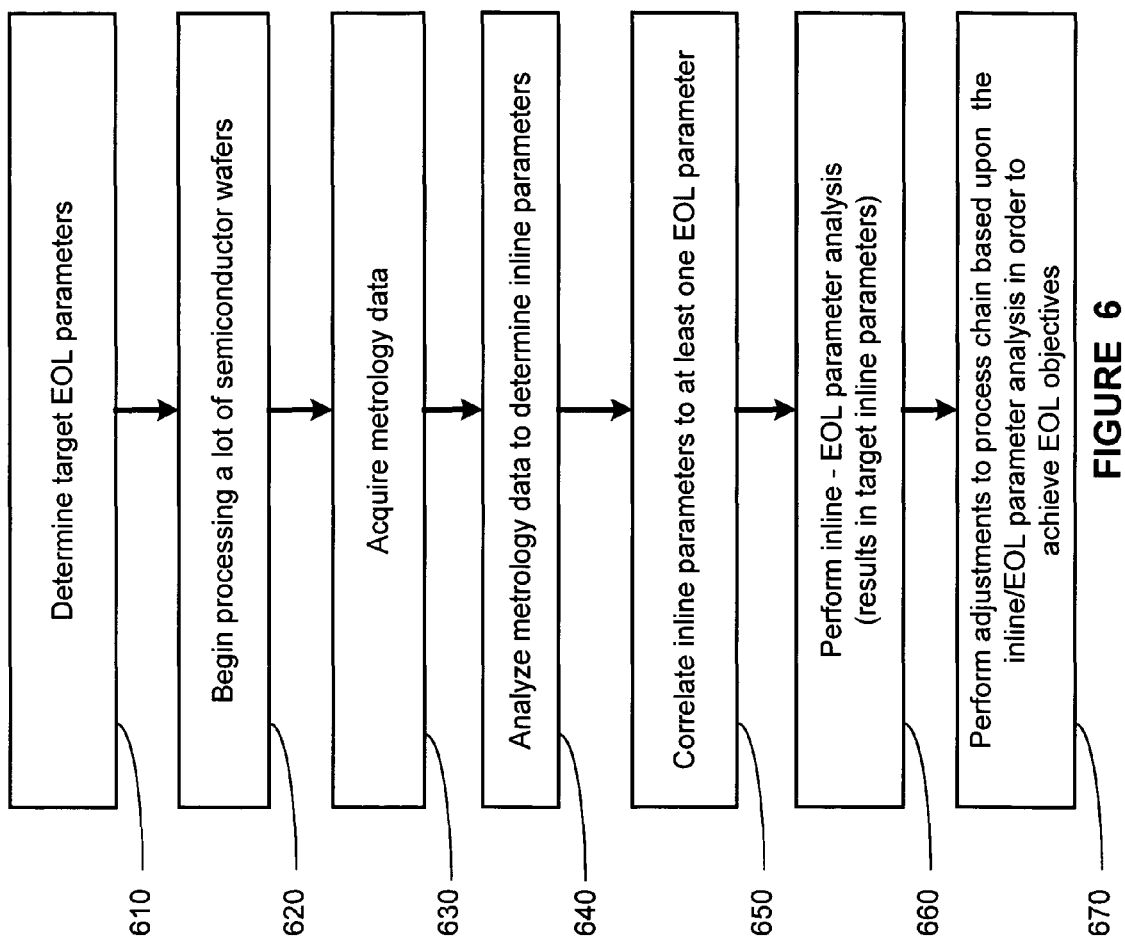
FIG. 6 illustrates a flowchart depiction of a method in accordance with one illustrative embodiment of the present invention.

Turning now to FIG. 6, a flow chart depiction of a method for implementing embodiments of the present invention is illustrated. In one embodiment, the system 300 may determine target EOL parameters, such as a desired yield for a particular lot of semiconductor wafers 105, a desired performance of devices produced from the semiconductor wafers 105, the desired reliability of the devices, and/or the like (block 610). The EOL parameters may be determined based upon historical data, desired outcome requirements, and the like. In one embodiment, the EOL parameter may be selected by a engineer/operator responsible for a particular EOL parameter. One or more business rules, such as market demand for a particular device manufactured from the processed semiconductor wafers 105, may be used to provide emphasis on one or more EOL parameters. The system 300 then begins processing a batch/lot of semiconductor wafers 105 (block 620). Upon processing at least one semiconductor wafer 105, the system 300 may acquire metrology data relating to the processed semiconductor wafers 105 (block 630). In one embodiment, the metrology data is acquired using one or more metrology tools 550.

The system 300 then analyzes the metrology data to determine inline parameters relating to the processed semiconductor wafers 105 (block 640). The determined inline parameters may be based upon measurements that include, but are not limited to, critical dimension measurements, film thickness measurements, overlay measurements, and the like. The system 300 then correlates inline parameters to at least one EOL parameter (block 650). In one embodiment, statistical analysis of a plurality of processed semiconductor wafers 105 may be used to correlate the inline parameter to the EOL parameter(s). The inline parameters may be correlated to the EOL target parameter using the metrology data inline parameter-EOL target data correlation unit 320 described above.

The system 300 may then perform an inline-EOL parameter analysis, which results in target inline parameters that may be used to produce targeted EOL parameters relating to the processed semiconductor wafers 105 (block 660). Modifications to control input parameters that control processing of the semiconductor wafers 105 may be made to achieve the target inline parameters. A more detailed illustration and description of the steps for performing the inline-EOL parameter analysis is provided in FIG. 7 and accompanying description below.

Figure 8:
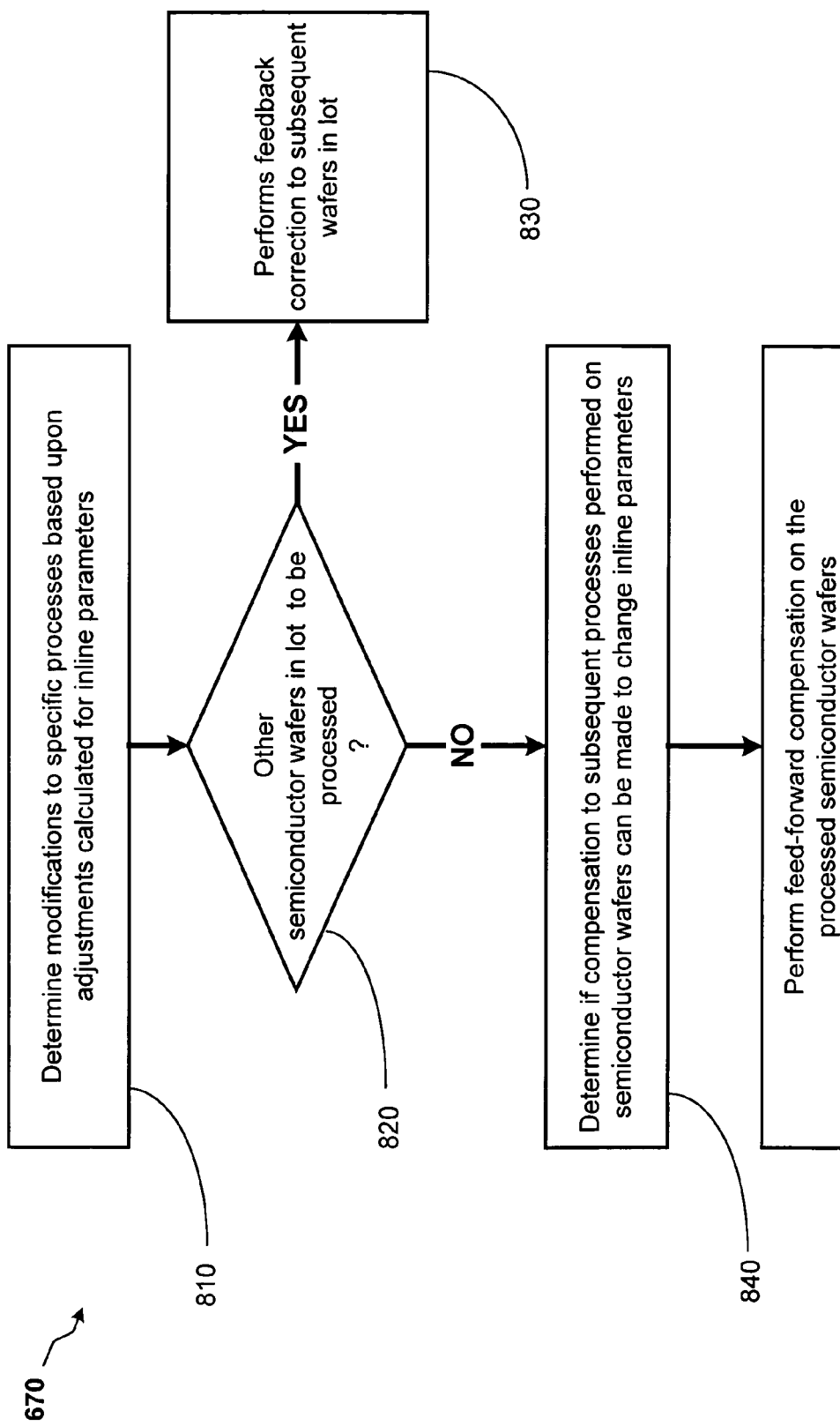
FIG. 8 illustrates a flowchart depiction of a method of performing adjustments to a process chain based upon the inline-EOL parameter analysis, as indicated in FIG. 6, in accordance with one illustrative embodiment of the present invention.

Upon determining the target inline parameters for achieving targeted EOL parameters, the system 300 then may perform adjustments to the process chain (i.e., a series of processes performed on the semiconductor wafers 105) based upon the inline-EOL parameter analysis in order to achieve the end-of-line parameter objectives determined by the target EOL parameters (block 670). A more detailed flow chart depiction and description of performing the adjustments to the processes performed on the semiconductor wafers 105 is illustrated in FIG. 8 and accompanying description below.

Figure 7:
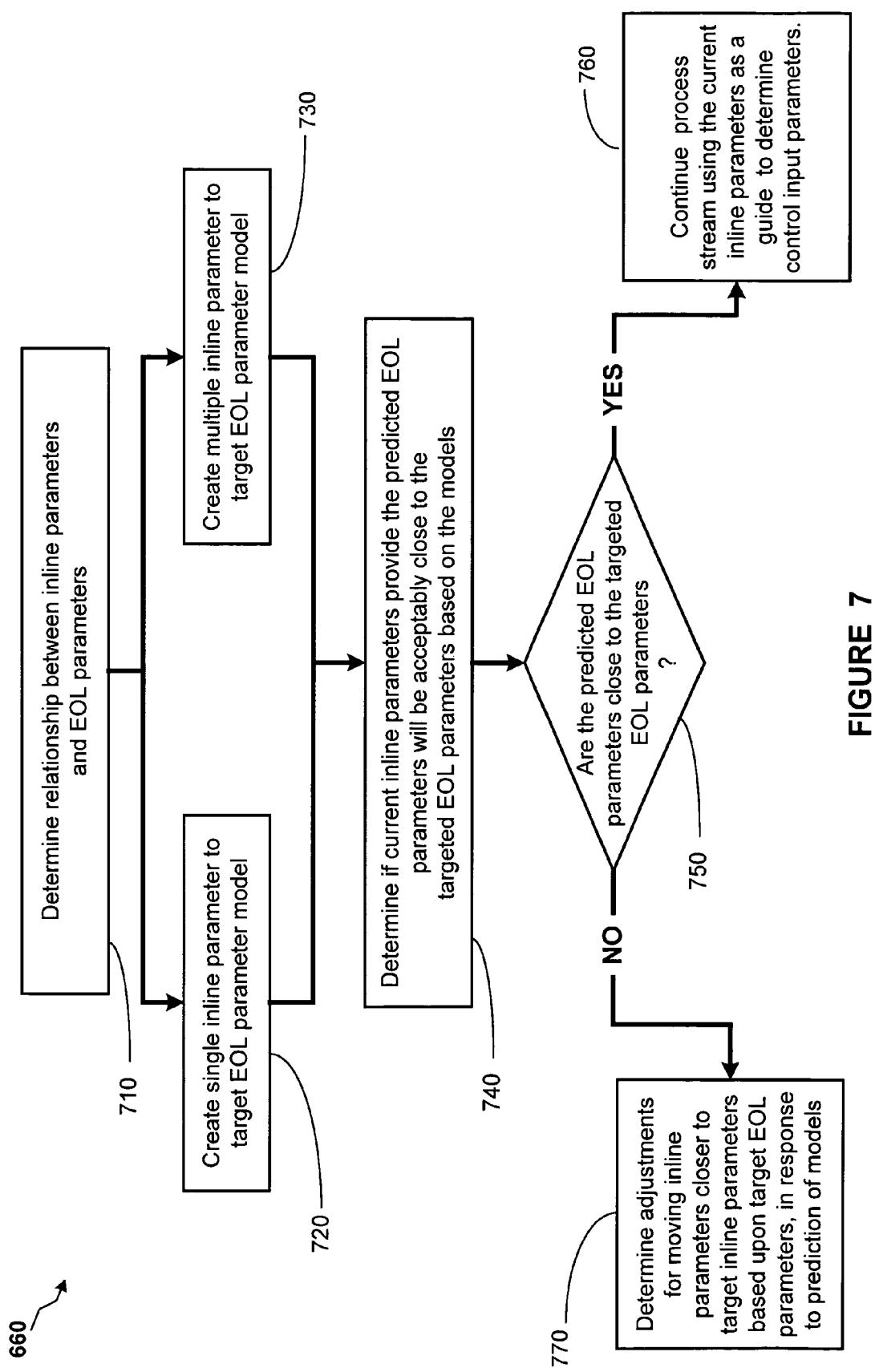
FIG. 7 illustrates a flowchart depiction of a method of performing an inline-EOL parameter analysis, as indicated in FIG. 6, in accordance with one illustrative embodiment of the present invention.

Turning now to FIG. 7, a flow chart description of performing the inline-EOL parameter analysis is illustrated as indicated in block 660 of FIG. 6. Upon receiving at least one target EOL parameter and at least one target inline parameter, the system 300 determines a relationship between the inline parameter and the EOL parameter (block 710). For example, a particular critical dimension parameter of a structure formed on the semiconductor wafers 105 may be linked to particular device performance speeds of devices produced from the processed semiconductor wafers 105. The system 300 may create a single inline parameter-target EOL parameter model 410 (block 720). For example, the system 300 may create a critical dimension to device performance model, the system 300 may create a film thickness-device reliability model, which may relate one or more film thickness measurements of the semiconductor wafers 105 to reliability of devices ultimately produced from the semiconductor wafers 105. As another example, the system 300 may create an overlay accuracy-device yield model, which may relate one or more overlay measurements on the semiconductor wafers 105 to reliability of devices ultimately produced from the semiconductor wafers 105. Other similar inline parameter-EOL parameter models may be defined by those skilled in the art having benefit of the present disclosure.

The system 300 may also create a multiple inline parameters-EOL parameter model 420 (block 730). For example, the system 300 may model the behavior of the critical dimension of a structure formed on the semiconductor wafers 105 and the film thickness parameters of processed semiconductor wafers 105, to a targeted device performance parameter. The models generated may then be used to produce target inline parameters that are to be maintained in order to achieve targeted EOL parameters. The target inline parameter data may be used by the system 300 to determine if based on the models, the current inline parameters being targeted during processing of the wafers 105 would lead to predicted EOL parameters that achieve or approach the targeted EOL parameters (block 740). In other words, the system 300 determines whether the processing of the semiconductor wafers 105 based on the targeted inline parameters will result in the targeted EOL parameters.

The system 300 makes a determination whether the predicted EOL parameters that are based upon the current inline parameters are, within acceptable limits of the targeted EOL parameters (block 750). If the system 300 determines that the predicted EOL parameters, according to the models, are sufficiently close to the targeted EOL parameters, the system 300 continues the current process stream being performed on the lot of semiconductor wafers 105 (block 760). The system 300 uses the current inline parameters as a guide to determine the control input parameters to control the current process stream. In other words, the control input parameters are formulated to maintain the current inline parameters during processing of the semiconductor wafers 105 since the current inline parameters should lead to the targeted EOL parameters.

When, the system 300 determines that the predicted EOL parameters, according to the models, may not be within acceptable limits of the targeted EOL parameters, the system 300 determines adjustments that are to be made to the inline parameters to cause the predicted EOL parameters to approach the target EOL parameters (block 770). In other words, adjustments to the current processes performed on the semiconductor wafers 105 may be made to change the inline parameters, such that the predicated EOL parameters will be sufficiently close to the targeted EOL parameters. Adjustments to the current processes made to change the inline parameters may lead to the movement of the current inline parameters towards the target inline parameters, which may ultimately lead to realizing the EOL parameters at the conclusion of the process chain. The completion of the steps provided in FIG. 7 substantially completes the process of performing the inline-EOL parameter analysis as indicated in block 660 of FIG. 6.

Turning now to FIG. 8, a flow chart illustration of performing adjustments to the processing chain based upon the inline-EOL parameter analysis to achieve EOL objectives, as indicated in block 670 of FIG. 6, is illustrated. Based upon the inline-EOL parameter analysis described above, the system 300 determines particular modifications that may be made to specific processes performed on the semiconductor wafers 105 based upon the adjustments calculated for the inline parameters (block 810). In other words, based upon the data from the inline-EOL parameter analysis, particular targeted inline parameters are used to determine modifications that are to be made on one or more processes performed on the semiconductor wafers 105.

The system 300 makes a determination whether there are other semiconductor wafers 105 within a particular lot to be processed (block 820). When the system 300 determines that there are other semiconductor wafers 105 in the lot to be processed, the system 300 may perform a feedback correction to the subsequent semiconductor wafers 105 in the lot. The feedback correction is performed to adjust the process to achieve inline parameters that are sufficiently close to the targeted inline parameters, as specified by the inline parameter-target EOL parameter model 330 (block 830). The feedback correction may comprise changing one or more control input parameters to adjust the process performed on the subsequent semiconductor wafers 105 in the lot. The feedback corrections may include, but are not limited to, changing a process recipe, an etch time for an etch process, an intensity of the light used in photolithography processes, and/or the like. The feedback correction unit 340 may modify the control input parameters to implement the feedback corrections performed on the remaining semiconductor wafers 105 in the lot, in order to bring the actual inline parameters closer to the targeted inline parameters.

When the system 300 determines there are no additional semiconductor wafers 105 in the lot upon which a particular process is to be performed, the system 300 determines if compensation to subsequent processes performed on semiconductor wafers 105 may be made to bring the inline parameters closer to the targeted inline parameters as calculated by the inline parameter-target EOL parameter model 330 (block 840). The feed-forward compensation unit 350 may modify the control input parameters to implement the compensation to produce the desired inline parameters.

Upon determining that a compensation process may be made to improve the accuracy of the inline parameters toward the targeted inline parameters, a feed-forward compensation may be performed by the system 300 (block 850). The feed-forward compensation process may comprise modifying control input parameters of subsequent processes performed on the semiconductor wafers 105 to compensate for errors or deviations found in the inline parameters. For example, an etch time may be increased to compensate for a deviation of the critical measurement relating to a structure formed on the semiconductor wafer 105. This feed-forward compensation may bring the targeted critical dimension within an acceptable range defined by the targeted inline parameter. The completion of the steps described in FIG. 8 substantially completes the process of performing adjustments to the processed chain based upon the inline-EOL parameters to achieve the EOL objectives, as indicated in block 670 of FIG. 6.

Utilizing the system 300 and the methods described by embodiments of the present invention, processing of semiconductor wafers 105 may be adjusted using the models described above, to achieve targeted EOL parameters. Adjustments to processing of semiconductor wafers 105 during the manufacturing process may be made to achieve desired reliability, yield, performance, or other EOL parameters.

The principles taught by the present invention can be implemented in an Advanced Process Control (APC) Framework, such as a Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699—Provisional Specification for CIM Framework Domain Architecture) and APC (SEMI E93-0999—Provisional Specification for CIM Framework Advanced Process Control Component) specifications are publicly available from SEMI. The APC is a preferred platform from which to implement the control strategy taught by the present invention. In some embodiments, the APC can be a factory-wide software system; therefore, the control strategies taught by the present invention can be applied to virtually any of the semiconductor manufacturing tools on the factory floor. The APC framework also allows for remote access and monitoring of the process performance. Furthermore, by utilizing the APC framework, data storage can be more convenient, more flexible, and less expensive than local drives. The APC platform allows for more sophisticated types of control because it provides a significant amount of flexibility in writing the necessary software code.

Deployment of the control strategy taught by the present invention onto the APC framework could require a number of software components. In addition to components within the APC framework, a computer script is written for each of the semiconductor manufacturing tools involved in the control system. When a semiconductor manufacturing tool in the control system is started in the semiconductor manufacturing fab, it generally calls upon a script to initiate the action that is required by the process controller, such as the overlay controller. The control methods are generally defined and performed in these scripts. The development of these scripts can comprise a significant portion of the development of a control system. The principles taught by the present invention can be implemented into other types of manufacturing frameworks.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method, comprising:
   determining a target end-of-line parameter relating to a semiconductor wafer by modeling said end-of-line parameter; and
   controlling an inline parameter relating to processing of said semiconductor wafer in response to said target end-of-line (EOL) parameter using a controller, controlling said inline parameter comprising adjusting a target inline parameter that correlates to said EOL parameter.

2. The method of claim 1, wherein determining said target end-of-line parameter further comprises determining at least one of a reliability of a device manufactured from said semiconductor wafer, a yield of acceptable devices manufactured from said semiconductor wafer, and a performance of said device manufactured from said semiconductor wafer.

3. The method of claim 1, further comprising processing at least one semiconductor wafer in a lot based upon said target end-of-line parameters.

4. The method of claim 3, further comprising acquiring metrology data from said processed semiconductor wafer to determine an inline parameter.

5. The method of claim 4, wherein controlling an inline parameter relating to processing of said semiconductor wafer further comprises controlling at least one of a critical dimension of a feature, a film thickness, accuracy of a photolithography overlay step, duration of deposition process, and an electrical resistivity.

6. The method of claim 1, wherein controlling an inline parameter relating to processing of said semiconductor wafer in response to said target end-of-line parameter further comprises developing an inline-target EOL parameter model for correlating at least one inline parameter to an EOL parameter.

7. The method of claim 6, wherein correlating at least one inline parameter to an EOL parameter further comprises determining a relationship between said inline parameter and said EOL parameter.

8. The method of claim 6, wherein controlling an inline parameter relating to processing of said semiconductor wafer in response to said target end-of-line (EOL) parameter using a controller further comprises using a weighted function to provide more weight to a first EOL parameter as compared to a second EOL parameter for controlling said inline parameter to be more responsive to said first EOL parameter.

9. The method of claim 6, wherein controlling an inline parameter relating to processing of said semiconductor wafer in response to said target end-of-line parameter further comprises adjusting at least one control input parameter in response to correlating said inline parameter to said EOL parameter.

10. The method of claim 9, wherein adjusting at least one control input parameter in response to correlating said inline parameter to said EOL parameter further comprises performing a feedback adjustment of at least one control input parameter for processing a second semiconductor wafer.

11. The method of claim 9, wherein adjusting at least one control input parameter in response to correlating said inline parameter to said EOL parameter further comprises performing a feed-forward adjustment of at least one control input parameter for performing a subsequent process on said semiconductor wafer.

12. A method, comprising:
   processing at least one semiconductor wafer;
   determining a target end-of-line (EOL) parameter relating to said semiconductor wafer by modeling said end-of-line parameter;
   determining an inline parameter relating to said semiconductor wafer;
   correlating said inline parameter to said EOL parameter using a model that relates said EOL parameter to said inline parameter;
   determining a target inline parameter relating to said EOL parameter based upon correlating said inline parameter to said EOL parameter; and
   adjusting at least one control input parameter for controlling said inline parameter based upon said target EOL parameter.

13. The method of claim 12, wherein determining said target end-of-line parameter further comprises determining at least one of a reliability of a device manufactured from said semiconductor wafer, a yield of acceptable devices manufactured from said semiconductor wafer, and a performance of said device manufactured from said semiconductor wafer.

14. The method of claim 12, wherein controlling an inline parameter relating to processing of said semiconductor wafer further comprises controlling at least one of a critical dimension of a feature, a film thickness, accuracy of a photolithography overlay step, duration of deposition process, and an electrical resistivity.

15. The method of claim 12, wherein correlating said inline parameter to said EOL parameter further comprises determining a relationship between said inline parameter and said EOL parameter.

16. An apparatus, comprising:
means for determining a target end-of-line parameter relating to a semiconductor wafer by modeling said end-of-line parameter; and
means for controlling an inline parameter relating to processing of said semiconductor wafer in response to said target end-of-line (EOL) parameter using a controller, controlling said inline parameter comprising adjusting a target inline parameter that correlates to said EOL parameter.

17. A system, comprising:
a processing tool to process a first semiconductor wafer; and
a process controller operatively coupled to said processing tool, said process controller to control a process operation performed by said processing tool to adjust an inline parameter relating to said semiconductor wafer based upon a target end-of-line (EOL) parameter of said first semiconductor wafer, said target EOL parameter being determined by modeling said end-of-line parameter.

18. The system of claim 17, further comprising an inline-EOL parameter model operatively coupled to said process controller, said inline-EOL parameter model to correlate said inline parameter with said EOL parameter.

19. The system of claim 18, wherein said process controller being adapted to modify at least one control input parameter that controls a process operation of said processing tools, based upon said correlation of said inline parameter with said EOL parameter.

20. The system of claim 18, further comprising:
a metrology tool operatively coupled with said process controller, said metrology tool to acquire metrology data relating to said inline parameter;
a feedback correction unit operatively coupled to said process controller and said processing tool, said feedback correction unit to provide feedback data to control said process operation of a second semiconductor wafer based upon said metrology data relating to said inline parameter; and
a feed-forward compensation unit operatively coupled to said process controller and said processing tool, said feed-forward compensation unit to provide feed-forward data to control a second process operation performed on said first semiconductor wafer based upon said metrology data relating to said inline parameter.

21. An apparatus, comprising:
a process controller for controlling a processing tool, said process controller to control a process operation performed by said processing tool to adjust an inline parameter relating to a first semiconductor wafer based upon a target end-of-line (EOL) parameter of said first semiconductor wafer, said target EOL parameter being determined by modeling said end-of-line parameter.

22. The apparatus of claim 21, wherein said process controller further comprising an inline-EOL parameter model, said inline-EOL parameter model to correlate said inline parameter with said EOL parameter.

23. The apparatus of claim 22, wherein said process controller being adapted to modify at least one control input parameter that controls a process operation of said processing tools, based upon said correlation of said inline parameter with said EOL parameter.

24. The apparatus of claim 22, wherein said process controller further comprising:
a feedback correction unit, said feedback correction unit to provide feedback data to control said process operation of a second semiconductor wafer based upon said metrology data relating to said inline parameter based upon said correlation of said inline parameter with said EOL parameter; and
a feed-forward compensation unit operatively coupled to said process controller and said processing tool, said feed-forward compensation unit to provide feed-forward data to control a second process operation performed on said first semiconductor wafer based upon said metrology data relating to said inline parameter based upon said correlation of said inline parameter with said EOL parameter.

25. A computer readable program storage device encoded with instructions that, when executed by a computer, performs a method, comprising:
determining a target end-of-line parameter relating to a semiconductor wafer by modeling said end-of-line parameter; and
controlling an inline parameter relating to processing of said semiconductor wafer in response to said target end-of-line (EOL) parameter using a controller, controlling said inline parameter comprising adjusting a target inline parameter that correlates to said EOL parameter.

26. The computer readable program storage device encoded with instructions that, when executed by a computer, performs the method of claim 25, wherein determining said target end-of-line parameter further comprises determining at least one of a reliability of a device manufactured from said semiconductor wafer, a yield of acceptable devices manufactured from said semiconductor wafer, and a performance of said device manufactured from said semiconductor wafer.

27. The computer readable program storage device encoded with instructions that, when executed by a computer, performs the method of claim 25, the method further comprising processing at least one semiconductor wafer in a lot based upon said target end-of-line parameters.

28. The computer readable program storage device encoded with instructions that, when executed by a computer, performs the method of claim 27, the method further comprising acquiring metrology data from said processed semiconductor wafer to determine an inline parameter.

29. The computer readable program storage device encoded with instructions that, when executed by a computer, performs the method of claim 28, wherein controlling an inline parameter relating to processing of said semiconductor wafer further comprises controlling at least one of a critical dimension of a feature, a film thickness, accuracy of a photolithography overlay step, duration of deposition process, and an electrical resistivity.

30. The computer readable program storage device encoded with instructions that, when executed by a computer, performs the method of claim 25, wherein controlling an inline parameter relating to processing of said semiconductor wafer in response to said target end-of-line parameter further comprises developing an inline-target EOL parameter model for correlating at least one inline parameter to an EOL parameter.

31. The computer readable program storage device encoded with instructions that, when executed by a computer, performs the method of claim 30, wherein correlating at least one inline parameter to an EOL parameter further comprises determining a relationship between said inline parameter and said EOL parameter.

32. The computer readable program storage device encoded with instructions that, when executed by a computer, performs the method of claim 30, wherein controlling an inline parameter relating to processing of said semiconductor wafer in response to said target end-of-line (EOL) parameter using a controller further comprises using a weighted function to provide more weight to a first EOL parameter as compared to a second EOL parameter for controlling said inline parameter to be more responsive to said first EOL parameter.

33. The computer readable program storage device encoded with instructions that, when executed by a computer, performs the method of claim 30, wherein controlling an inline parameter relating to processing of said semiconductor wafer in response to said target end-of-line parameter further comprises adjusting at least one control input parameter in response to correlating said inline parameter to said EOL parameter.

34. The computer readable program storage device encoded with instructions that, when executed by a computer, performs the method of claim 33, wherein adjusting at least one control input parameter in response to correlating said inline parameter to said EOL parameter further comprises performing a feedback adjustment of at least one control input parameter for processing a second semiconductor wafer.

35. The computer readable program storage device encoded with instructions that, when executed by a computer, performs the method of claim 33, wherein adjusting at least one control input parameter in response to correlating said inline parameter to said EOL parameter further comprises performing a feed-forward adjustment of at least one control input parameter for performing a subsequent process on said semiconductor wafer.

* * * * *

UNITED STATES PATENT AND TRADEMARK OFFICE
CERTIFICATE OF CORRECTION

| | | |
|---|---|---|
| PATENT NO. | : 7,797,073 B1 | Page 1 of 1 |
| APPLICATION NO. | : 10/156541 | |
| DATED | : September 14, 2010 | |
| INVENTOR(S) | : Pasadyn et al. | |

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 2152 days.

Signed and Sealed this
Twenty-first Day of August, 2012

David J. Kappos
*Director of the United States Patent and Trademark Office*